United States Patent
Shih et al.

(10) Patent No.: US 9,721,799 B2
(45) Date of Patent: Aug. 1, 2017

(54) SEMICONDUCTOR PACKAGE WITH REDUCED VIA HOLE WIDTH AND REDUCED PAD PATCH AND MANUFACTURING METHOD THEREOF

(71) Applicant: Advanced Semiconductor Engineering, Inc., Kaohsiung (TW)

(72) Inventors: Yu-Lin Shih, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 14/536,253

(22) Filed: Nov. 7, 2014

(65) Prior Publication Data

US 2016/0133537 A1    May 12, 2016

(51) Int. Cl.
*H01L 21/288*    (2006.01)
*H01L 23/00*    (2006.01)
(Continued)

(52) U.S. Cl.
CPC ........ *H01L 21/288* (2013.01); *H01L 21/6835* (2013.01); *H01L 23/3128* (2013.01); *H01L 23/498* (2013.01); *H01L 23/49816* (2013.01); *H01L 23/5389* (2013.01); *H01L 24/19* (2013.01); *H01L 24/20* (2013.01);
(Continued)

(58) Field of Classification Search
None
See application file for complete search history.

(56) References Cited

U.S. PATENT DOCUMENTS 5,250,843 A    10/1993    Eichelberger
6,423,570 B1    7/2002    Ma et al.
(Continued)

FOREIGN PATENT DOCUMENTS

KR    20010061784    7/2001

OTHER PUBLICATIONS

Non-Final Office Action received for U.S. Appl. No. 14/703,794 mailed Mar. 9, 2016, 17 pages.
(Continued)

*Primary Examiner* — Bilkis Jahan
(74) *Attorney, Agent, or Firm* — Foley & Lardner LLP; Cliff Z. Liu

(57) ABSTRACT

The present disclosure relates to a semiconductor package and method of making the same. The semiconductor package includes an encapsulation layer, a dielectric layer, a component, and a first patterned conductive layer. The encapsulation layer has a first surface. The component is within the encapsulation layer and has a front surface and a plurality of pads on the front surface. The dielectric layer is on the first surface of the encapsulation layer, and defines a plurality of via holes; wherein the plurality of pads of the component are against the dielectric layer; and wherein the dielectric layer has a second surface opposite the first surface of the encapsulation layer. Each of plurality of via holes extends from the second surface of the dielectric layer to a respective one of the plurality of the pads. The first patterned conductive layer is within the dielectric layer and surrounds the via holes.

19 Claims, 8 Drawing Sheets

(51) Int. Cl.
*H01L 23/31* (2006.01)
*H01L 23/498* (2006.01)
*H01L 23/538* (2006.01)
*H01L 21/683* (2006.01)
*H01L 21/56* (2006.01)
*H01L 21/768* (2006.01)

(52) U.S. Cl.
CPC .............. *H01L 24/32* (2013.01); *H01L 24/83* (2013.01); *H01L 21/568* (2013.01); *H01L 21/76805* (2013.01); *H01L 21/76838* (2013.01); *H01L 2221/68345* (2013.01); *H01L 2221/68372* (2013.01); *H01L 2224/04105* (2013.01); *H01L 2224/12105* (2013.01); *H01L 2224/32225* (2013.01); *H01L 2224/838* (2013.01); *H01L 2224/92144* (2013.01)

(56) References Cited

U.S. PATENT DOCUMENTS

| | | |
|---|---|---|
| 6,680,529 B2 | 1/2004 | Chen et al. |
| 6,909,054 B2 | 6/2005 | Sakamoto et al. |
| 6,914,322 B2 | 7/2005 | Iijima et al. |
| 7,005,327 B2 * | 2/2006 | Kung ............... H01L 21/4857 257/E23.062 |
| 7,285,862 B2 | 10/2007 | Sunohara et al. |
| 7,498,200 B2 | 3/2009 | Sunohara et al. |
| 7,663,215 B2 | 2/2010 | Tuominen et al. |
| 7,732,712 B2 | 6/2010 | Yamano |
| 2005/0127492 A1 * | 6/2005 | Howard ............... H01L 23/13 257/691 |
| 2008/0036050 A1 | 2/2008 | Lin et al. |
| 2008/0150159 A1 * | 6/2008 | Aberin ............... H01L 21/563 257/778 |
| 2009/0075428 A1 | 3/2009 | Tang et al. |
| 2009/0215231 A1 | 8/2009 | Inoue |
| 2012/0086122 A1 * | 4/2012 | Cheng ............... H01L 24/05 257/738 |
| 2013/0075924 A1 * | 3/2013 | Lin ............... H01L 24/19 257/774 |
| 2014/0197505 A1 * | 7/2014 | Zhou ............... H01L 23/552 257/422 |

OTHER PUBLICATIONS

US Office Action on U.S. Appl. No. 14/703,794 DTD Sep. 28, 2016, 20 pages.

* cited by examiner

SEMICONDUCTOR PACKAGE WITH REDUCED VIA HOLE WIDTH AND REDUCED PAD PATCH AND MANUFACTURING METHOD THEREOF

BACKGROUND

1. Technical Field

The present disclosure relates to a semiconductor package and a manufacturing method thereof, and more particularly to a semiconductor package with an embedded component and a method of manufacturing the same.

2. Description of the Related Art

Semiconductor devices have become progressively more complex, driven at least in part by the demand for smaller sizes and enhanced processing speeds. At the same time, there is a demand to further miniaturize many electronic products including these semiconductor devices. Semiconductor devices are typically packaged, and then may be installed on a substrate including electrical circuitry, such as a circuit board. This results in space being occupied by both the semiconductor device package and the substrate, and in a surface area on the substrate being occupied by the semiconductor device package. In addition, cost may be incurred by performing packaging, board manufacturing, and assembly as separate processes. It would be desirable to reduce the space occupied by the semiconductor device on the substrate, and to simplify and combine the packaging, board manufacturing, and assembly processes as applied to the semiconductor device and the substrate.

SUMMARY

In accordance with an embodiment of the present disclosure, a semiconductor package includes an encapsulation layer, a dielectric layer, a component, and a first patterned conductive layer. The encapsulation layer has a first surface. The component is within the encapsulation layer and has a front surface and comprises a plurality of pads on the front surface. The dielectric layer is on the first surface of the encapsulation layer, and defines a plurality of via holes; wherein the plurality of pads of the component are against the dielectric layer; and wherein the dielectric layer has a second surface opposite the first surface of the encapsulation layer. Each of plurality of via holes extends from the second surface of the dielectric layer to a respective one of the plurality of pads. The first patterned conductive layer is within the dielectric layer and surrounds the via holes.

In accordance with another embodiment of the present disclosure, a semiconductor package includes a die, an encapsulation layer, a first dielectric layer, a plurality of conductive members, and a patterned conductive layer. The die comprises a die body and a plurality of pads, the die body has a front surface on which the plurality of pads are disposed. The encapsulation layer encapsulates an upper surface, the encapsulation layer buries the die body and exposes the front surface of the die body from the upper surface of the encapsulation layer. The first dielectric layer is disposed on the upper surface of the encapsulation layer and covers the plurality of pads. The plurality of conductive members penetrate the first dielectric layer. The patterned conductive layer is embedded in the first dielectric layer and electrically connected to the pads through the conductive members.

In accordance with an embodiment of the present disclosure, a method of making a semiconductor package includes: (a) forming a first patterned conductive layer; (b) forming a dielectric adhesive layer encapsulating the first patterned conductive layer; (c) attaching a die comprising a plurality of pads to the dielectric adhesive layer; (d) forming an encapsulation layer encapsulating the die; and (e) forming a plurality of conductive vias electrically connecting to the plurality of pads in the dielectric adhesive layer.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Various substrates having semiconductor devices embedded, so-called chip-embedded substrates, have been proposed, wherein a semiconductor device or a chip is first buried in a substrate and then a rerouting structure is fabricated in subsequent processes. The rerouting structure may include redistribution layer (RDL) and interconnects (e.g., conducting posts) extending from the RDL and terminating as contact structures at the surface of a thick support layer, for the next level packaging structure. The RDL may be supported by the passivation layer formed over the embedded semiconductor device. A polymeric layer is deposited over the RDL, and etched or drilled to provide a via for over-filling with a metal to form an interconnect (i.e., a conducting post) that extends above and beyond the opening of the via. A solder bump attached to the protruding end of the post is formed by electroless plating, screen or stencil printing.

Because the top surface of the passivation layer is not smooth due to the pads of embedded the semiconductor device which extend beyond the surface of the semiconductor device, high-resolution lithography is not effective to form the vias and RDL. Consequently, the pitch of the RDL is limited. Moreover, failure of the formation of the RDL may lead to loss of a packaged substrate, including a relatively high cost semiconductor device buried in the package substrate.

Described herein is a semiconductor package and method of making the same in which high-resolution techniques may be used to reduce via hole width, reduce pad pitch, improve yield, and reduce manufacturing cost.

Figure 1:
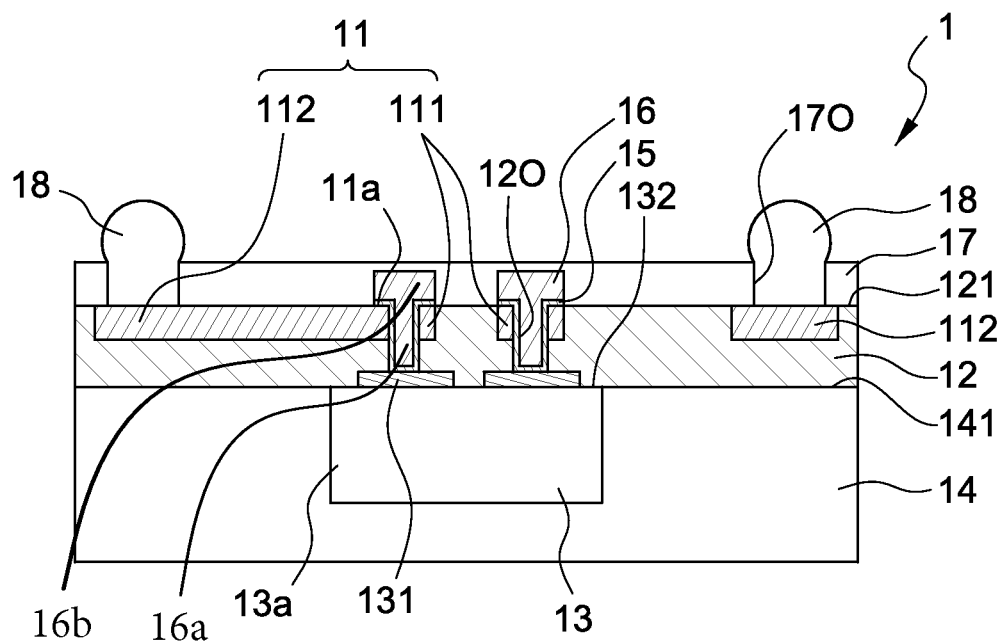
FIG. 1 illustrates a cross-sectional view of a semiconductor package in accordance with an embodiment of the present disclosure.

FIG. 1 illustrates a cross-sectional view of a semiconductor package in accordance with an embodiment of the present disclosure. The semiconductor package 1 includes an encapsulation layer 14, a dielectric layer 12, a die 13 (or other component), a patterned conductive layer 11, a patterned conductive layer 15, a patterned conductive layer 16, a solder resist layer 17 and a plurality of electrical connection elements 18.

The encapsulation layer 14 includes a surface 141. The encapsulation layer 14 may include, but is not limited to, a molding compound or pre-impregnated composite fibers (e.g., pre-preg). Examples of a molding compound may include but are not limited to an epoxy resin having fillers dispersed therein. Examples of a pre-preg may include but are not limited to a multi-layer structure formed by stacking or laminating a number of pre-impregnated material/sheets.

The die 13 may be, but is not limited to, an integrated circuit (IC) formed on or in a silicon substrate. The die 13 includes a die body 13a, a front surface 132 and a plurality of pads 131 disposed on the front surface 132. The die body 13a is buried or encapsulated in the encapsulation layer 14, and the front surface 132 and the pads 131 are exposed from the surface 141 of the encapsulation layer 14 such that the front surface 132 may be coplanar with the surface 141 of the encapsulation layer 14. The dielectric layer 12 is disposed on the surface 141 of the encapsulation layer 14 and on the front surface 132 and the pads 131 of the die 13. The die 13 is sandwiched between the encapsulation layer 14 and the dielectric layer 12 such that the plurality of pads 131 are buried or encapsulated in the dielectric layer 12. In another embodiment, there may be a passivation layer on the pads 131, and the pads 131 are not buried in the dielectric layer 12. The dielectric layer 12 includes a plurality of via holes 12O and a surface 121 opposing to the surface 141. The plurality of via holes 12O are formed from the surface 121 into the dielectric layer 12. The dielectric layer 12 may include a hydrophobic material. The dielectric layer 12 may be an adhesive to provide a bond between the die 13 and the dielectric layer 12 as well as a bond between the encapsulation layer 14 and the dielectric layer 12. Accordingly, the dielectric layer 12 directly contacts the front surface 132 and the pads 131 of the die 13. The dielectric layer 12 also directly contacts the surface 141 of the encapsulation layer 14.

The patterned conductive layer 11 is embedded in the dielectric layer 12. The patterned conductive layer 11 may be, but is not limited to, a redistribution layer (RDL). The patterned conductive layer 11 is adjacent to the surface 121 of the dielectric layer 12. The patterned conductive layer 11 includes a surface 11a which is coplanar with the surface 121 of the dielectric layer 12. The patterned conductive layer 11 may include but is not limited to copper (Cu). Because the patterned conductive layer 11 is embedded in the dielectric layer 12, a minimum line width of approximately 2 µm and a minimum line-to-line space (pitch) of approximately 2 µm may be achieved.

A part 111 of the patterned conductive layer 11 surrounds the via holes 12O. The part 111 of the patterned conductive layer 11 may have a ring-like profile having an opening aligned to the via holes 12O. The part 111 of the patterned conductive layer 11 may tightly and laterally surround each of the via holes 12O. The dielectric layer 12 between the part 111 of the patterned conductive layer 11 and the plurality of pads 131 laterally surrounds each of the via holes 12O. The part 111 of the patterned conductive layer 11 and a portion of the dielectric layer 12 form the side wall of each of the via holes 12O. Each of the plurality of pads 131 forms the bottom of a via hole 12O. The via holes 12O may have a small diameter and may be positioned closely together. For example, the via holes 12O may have a width that is equal to or less than about 70 µm, and a corresponding pitch between the pads 131 may be equal to or less than about 150 µm. For another example, the via holes 12O may have a width that is equal to or less than about 15 µm, and a corresponding pitch between the pads 131 may be equal to or less than about 40 µm. The width of the via holes 12O may be other values, such as equal to or less than about: 60 µm, 55 µm, 50 µm, 45 µm, 40 µm, 35 µm, 30 µm, 25 µm, or 20 µm, by way of example. Pitch between the pads 131 may also be other values, such as equal to or less than about: 140 µm, 130 µm, 120 µm, 110 µm, 100 µm, 90 µm, 80 µm, 70 µm, 60 µm, and 50 µm, for example.

The patterned conductive layer 15 is continuously and conformally formed on the surface 121 of the dielectric layer 12, and on the side wall and the bottom of each of the via holes 12O. The patterned conductive layer 15 may be, but is not limited to, a seed layer which may include, for example, an electroless deposited copper layer or titanium copper (TiCu) layer or other metal or metal alloy layer. The patterned conductive layer 15 may be disposed on top of the part 111 of the patterned conductive layer 11. The patterned conductive layer 15 contacts the bottom of each of the via holes 12O, in other words, the patterned conductive layer 15 contacts each of the plurality of the pads 131.

The patterned conductive layer 16 is disposed on the patterned conductive layer 15, thereby forming conductors, including conductive vias 16a in the via holes 12O, and further including additional portions 16b extending beyond the surface 121 of the dielectric layer 12 (e.g. portion 16b of the patterned conductive layer 16 is formed over or protruded from the surface 121 of the dielectric layer 12). The conductive vias 16a and additional portions 16b of the conductors may be integrally formed. The patterned conductive layer 16 may include structures other than the conductors described. The patterned conductive layer 16 may include a plating copper layer. The patterned conductive layer 15 and the conductors of the patterned conductive layer 16 (i.e., conductive portions 16a and additional portions 16b) together form conductive members that penetrate through the dielectric layer 12 and electrically connect the patterned conductive layer 11 and the pads 131.

A second dielectric layer 17, such as a solder resist layer, is disposed on the dielectric layer 12. The second dielectric layer 17 covers the dielectric layer 12, the patterned conductive layer 11 and the patterned conductive layer 16. The second dielectric layer 17 includes a number of openings 17O to expose a part 112 of the patterned conductive layer 11.

Each of the plurality of electrical connection elements 18 is disposed in one of the openings 17O formed in the second dielectric layer 17. The electrical connection elements 18 may include but are not limited to solder bumps or solder balls. Each of the electrical connection elements 18 contacts a respective part 112 of the patterned conductive layer 11.

FIG. 2A, FIG. 2B, FIG. 2C, FIG. 2D, FIG. 2E, FIG. 2F, FIG. 2G, FIG. 2H, FIG. 2I, FIG. 2J, FIG. 2K and FIG. 2L illustrate a manufacturing method in accordance with an embodiment of the present disclosure.

Figure 2A:
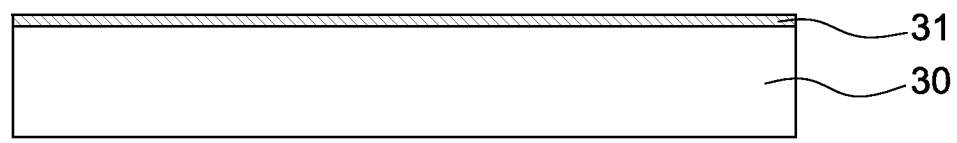
FIG. 2A, FIG. 2B, FIG. 2C, FIG. 2D, FIG. 2E, FIG. 2F, FIG. 2G, FIG. 2H, FIG. 2I, FIG. 2J, FIG. 2K and FIG. 2L illustrate a manufacturing method in accordance with an embodiment of the present disclosure.

Referring to FIG. 2A, a carrier 30 and a metal layer 31 are provided. The carrier 30 may be selected from, but is not limited to, a silicon, plastic or metal panel. The carrier 30 may facilitate the subsequent process thereon.

The metal layer 31 may be, but is not limited to, a relatively thin copper sheet or copper foil. The metal layer 31 may be, for example, approximately 2 µm in thickness.

Figure 2B:
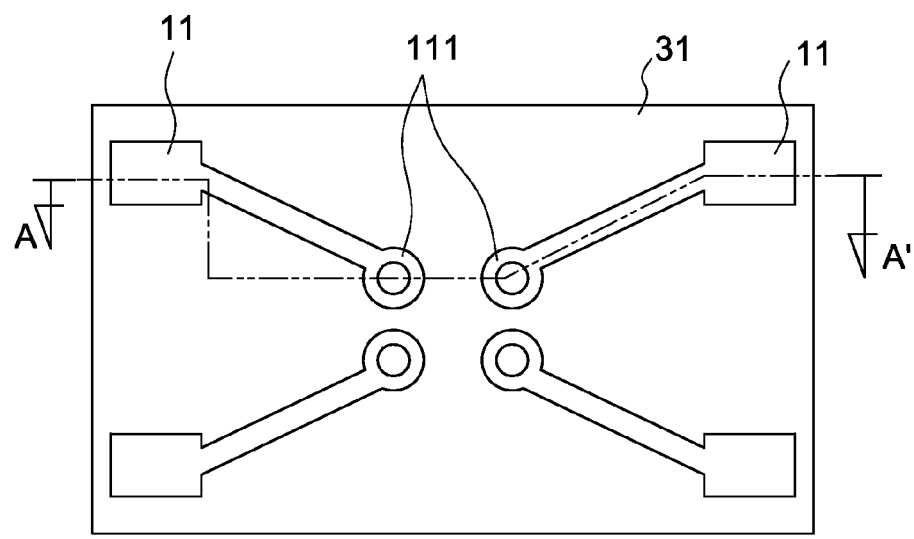
Figure 2C:
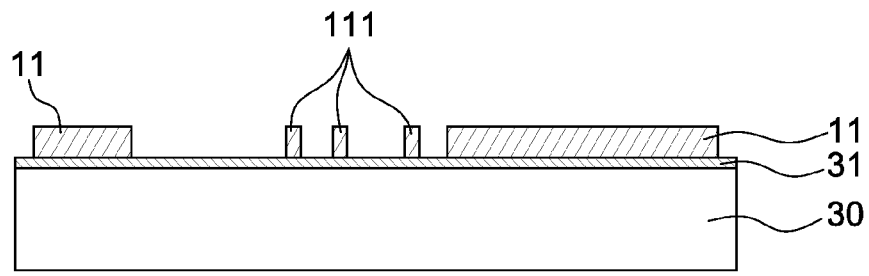

FIG. 2B is a top view illustrating a patterned conductive layer 11 formed on the metal layer 31. FIG. 2C is a cross-sectional view taken from line AN shown in FIG. 2B. Referring to FIG. 2C, the patterned conductive layer 11 may be formed, for example, by photo-lithography or plating technology. The patterned conductive layer 11 may be, but is not limited to being, a relatively flat and smooth redistribution layer (RDL). The patterned conductive layer 11 may include, but is not limited to, copper or another metal or alloy. The patterned conductive layer 11 may include a part 111 which facilitates via formation in the subsequent process. The part 111 of the patterned conductive layer 11 may have a ring-like profile having an opening to define the shape and location of the via in the subsequent process. If, after the patterned conductive layer 11 is formed, defects in the patterned conductive layer 11 are identified by automated optical inspection (AOI) or other inspection technique, no further process (e.g. die attachment) is performed for a particular device with defects, to save manufacturing cost. Accordingly, the overall yield rate is raised.

Figure 2D:
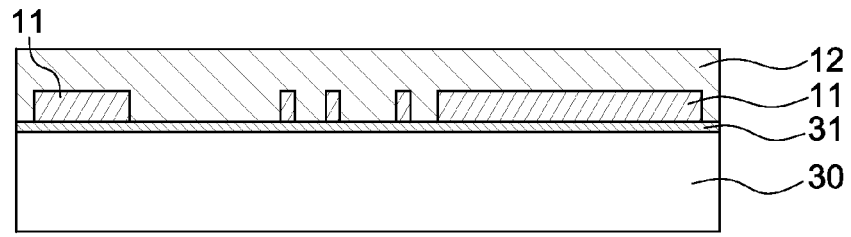

Referring to FIG. 2D, a dielectric adhesive layer 12 is formed on the metal layer 31 to bury or cover the patterned conductive layer 11. The dielectric adhesive layer 12 may be formed, for example, by laminating dielectric adhesive material to the patterned conductive layer 11.

Figure 2E:
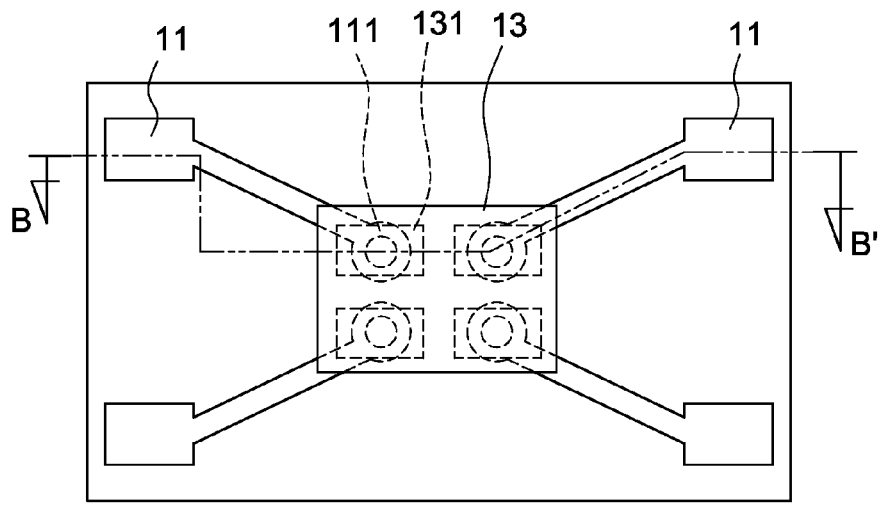
Figure 2F:
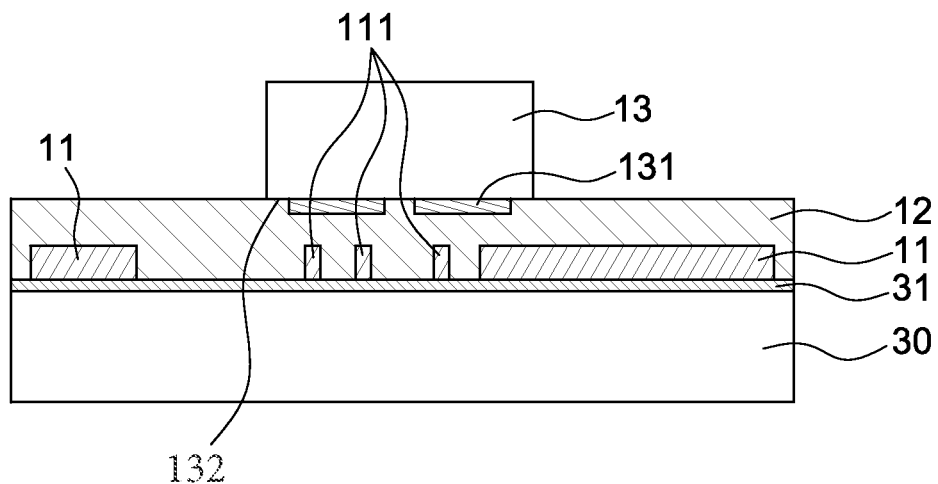

FIG. 2E is a top view illustrating a die 13 comprising a plurality of die pads 131, in which the die 13 and die pads 131 are bonded to the dielectric adhesive layer 12. FIG. 2F is a cross-sectional view taken from line BB' shown in FIG. 2E. Referring to FIG. 2F, the die 13 may be placed or pressed onto the dielectric adhesive layer 12 by, for example, a die bonding equipment. The die bonding equipment may attach the die 13 to the dielectric adhesive layer 12 such that the pads 131 are buried in the dielectric adhesive layer 12. The dielectric layer 12 may fix the die 13 and provide sufficient electrical insulation from the patterned conductive layer 11. For example, the dielectric layer 12 may have a thickness from approximately 5 μm to approximately 30 μm to provide sufficient electrical insulation; however, the thickness of the dielectric layer 12 may be within another range in other embodiments.

The dielectric adhesive layer 12 may be heated or cured after the bonding process of the die 13. The heated dielectric adhesive layer 12 becomes solidified or hardened, and therefore may provide a bond between the pads 131 and the dielectric adhesive layer 12, and a bond between the front surface 132 of the die 13 and the dielectric adhesive layer 12.

Figure 2G:
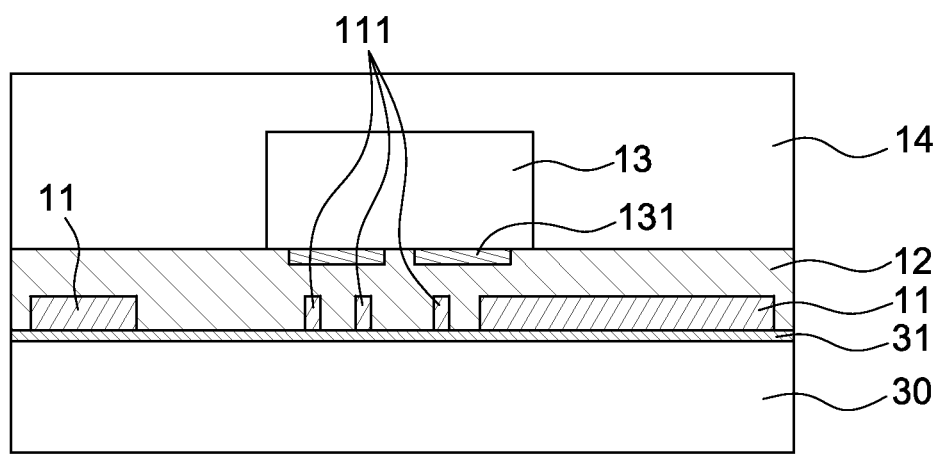

Referring to FIG. 2G, an encapsulation layer 14 is formed on the dielectric adhesive layer 12 to encapsulate the die 13. A technique for forming the encapsulation layer 14 may be, but is not limited to, a molding technology which uses a molding compound with the help of mold chase (not shown) to encapsulate the die 13. In another embodiment of the present disclosure, sheets made from pre-impregnated composite fibers (pre-preg) may be stacked or laminated to the dielectric adhesive layer 12 and the die 13 to form the encapsulation layer 14.

Figure 2H:
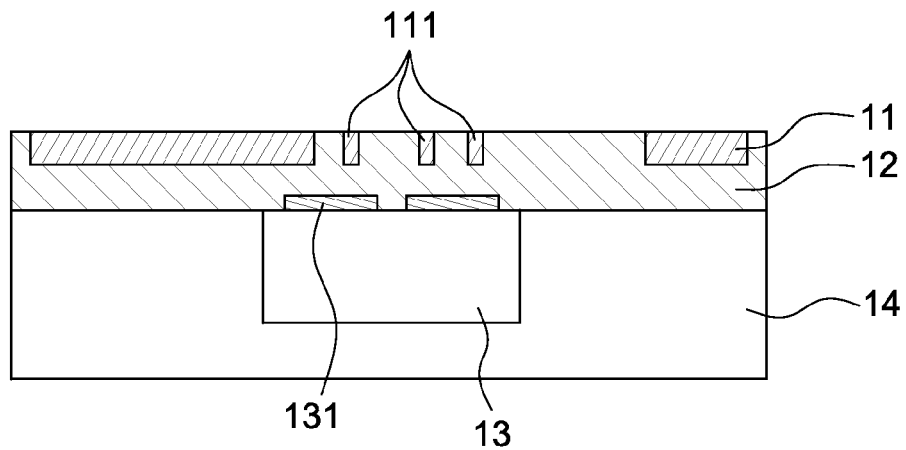

Referring to FIG. 2H, the metal layer 31, the patterned conductive layer 11, the dielectric adhesive layer 12, the die 13 and the encapsulation layer 14 are separated from the carrier 30, and the metal layer 31 is subsequently removed. In other words, the carrier 30 is removed from the metal layer 31 and the structure formed thereon, such as by mechanically removing the carrier 30. Subsequent to the removal of the carrier 30, the metal layer 31 is removed, such as by the use of etching technology.

Figure 2I:
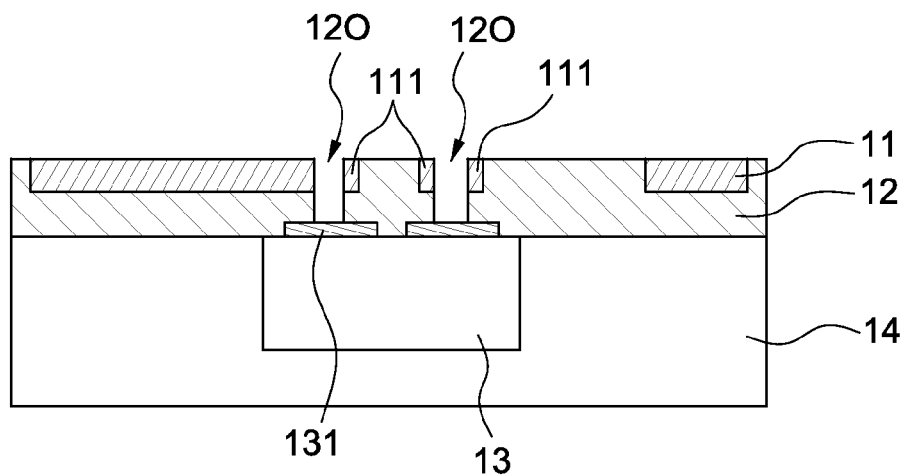

Referring to FIG. 2I, a number of via holes 12O are formed in the dielectric adhesive layer 12 to expose the pads 131 of the die 13. The ring-like profile of the part 111 of the patterned conductive layer 11 may be a mask to facilitate the formation of the via holes 12O. For example, the inner rim of part 111 of the patterned conductive layer 11 may help a laser drill equipment to precisely remove the dielectric adhesive layer 12 surrounded thereby.

Figure 2J:
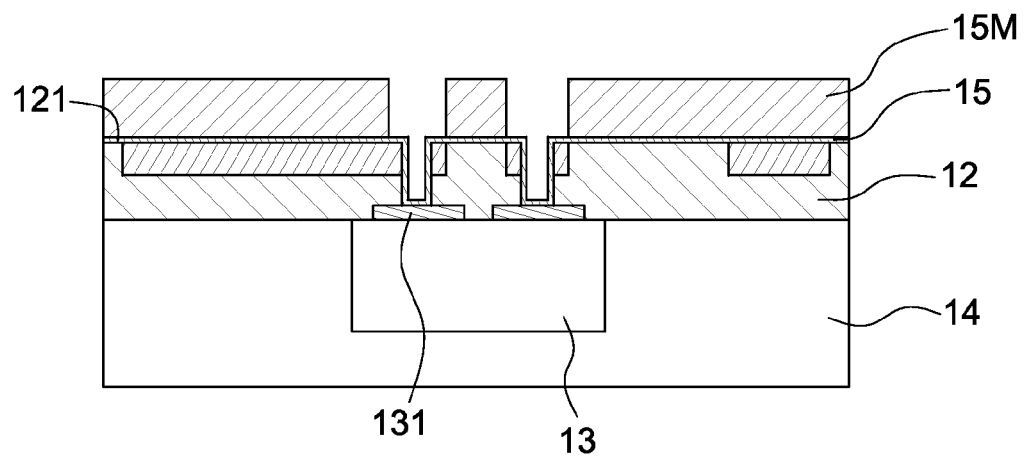

Referring to FIG. 2J, the patterned conductive layer 15 is continuously and conformally formed on the surface 121 of the dielectric adhesive layer 12, and along the side wall and the bottom of each of the via holes 12O. The patterned conductive layer 15 may be formed by, for example, sputtering technology. The patterned conductive layer 15 may be, but is not limited to, a seed layer 15 which may be made of, for example, TiCu. A patterned mask 15M may be formed by lithography technology on the patterned conductive layer 15. The mask 15M exposes parts of the patterned conductive layer 15.

Figure 2K:
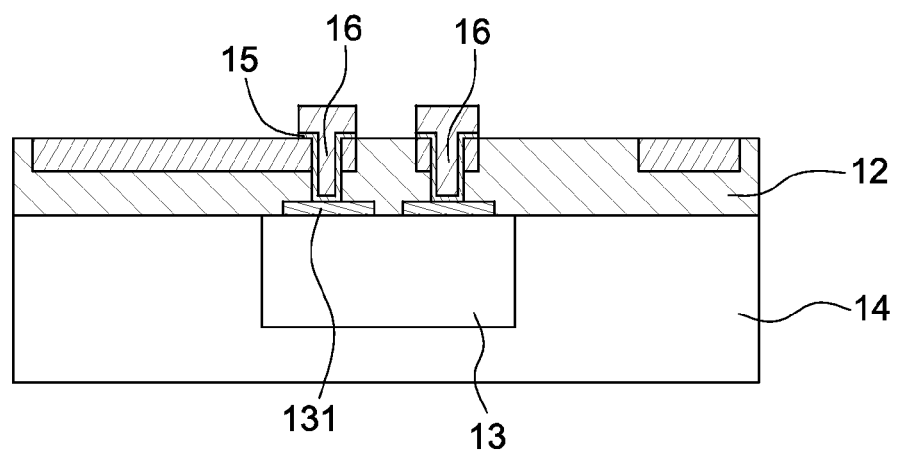

Referring to FIG. 2K, the patterned conductive layer 16 may be formed on the exposed parts of the patterned conductive layer 15, and the patterned mask 15M subsequently removed. The pattered conductive layer 16 includes the conductors formed in the via holes 12O and on the seed layer 15 covering the part 111 of the patterned conductive layer 11. The patterned conductive layer 16 may be formed, for example, by a plating technology. The patterned mask 15M and parts of the seed layer 15 may be removed subsequent to the formation of the patterned conductive layer 16.

Figure 2L:
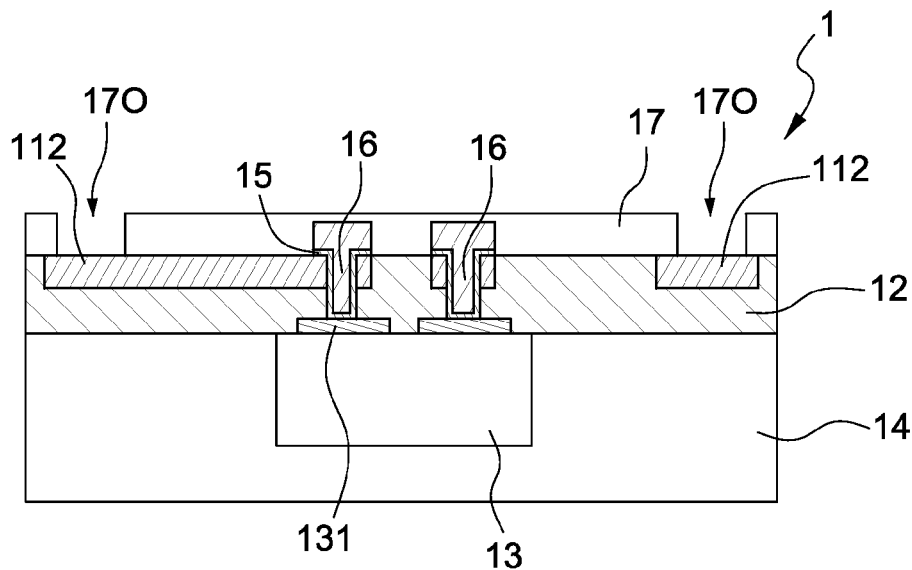

Referring to FIG. 2L, a second dielectric layer 17, such as a solder resist layer, may be formed on the dielectric adhesive layer 12. The second dielectric layer 17 may be coated or laminated on the dielectric adhesive layer 12. A number of openings 17O may be formed to expose a part 112 of the patterned conductive layer 11.

A plurality of electrical connection elements 18 (not shown in FIG. 2L) may be formed in the openings 17O to form the semiconductor package structure 1 as shown in FIG. 1. The electrical connection elements 18 may include, but are not limited to, solder bumps or solder balls. The electrical connection elements 18 may be formed by solder bump/ball implantation.

Figure 3:
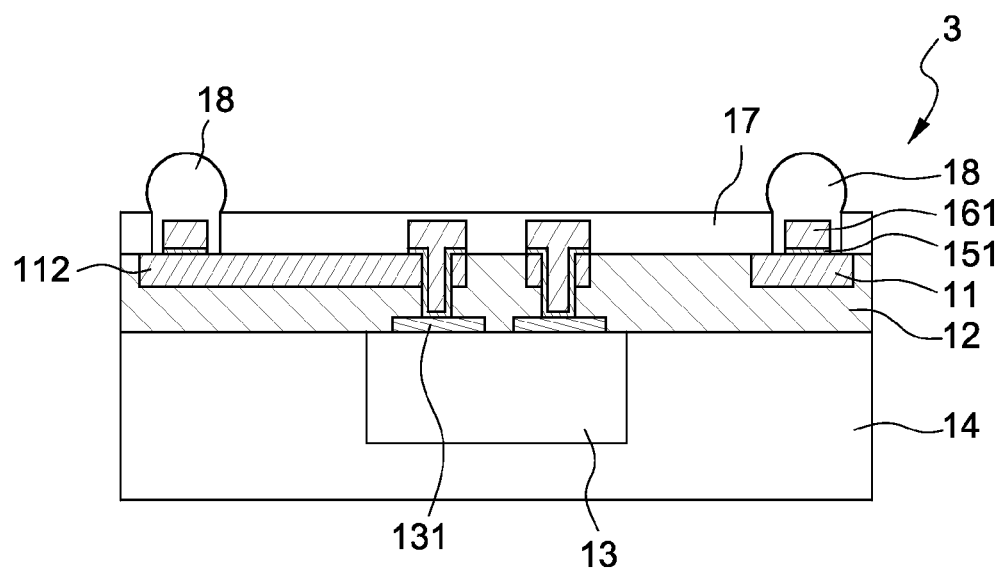
FIG. 3 illustrates a cross-sectional view of a semiconductor package in accordance with another embodiment of the present disclosure.

FIG. 3 illustrates a cross-sectional view of a semiconductor package structure in accordance with another embodiment of the present disclosure. The semiconductor package structure 3 may be similar to the semiconductor package structure 1 as described and illustrated with reference to FIG. 1, except that a part 151 of patterned conductive layer 15 and a part 161 of patterned conductive layer 16 may be formed on a respective part 112 of patterned conductive layer 11. The part 151 of patterned conductive layer 15 and the part 161 of patterned conductive layer 16 may be disposed in the opening 17O. In this embodiment, each of the electrical connection elements 18 covers a respective part 151 of patterned conductive layer 15 and a respective part 161 of patterned conductive layer 16. The part 151 of patterned conductive layer 15 and the part 161 of patterned conductive layer 16 can enhance the electrical conductivity of the electrical connection elements 18.

Figure 4:
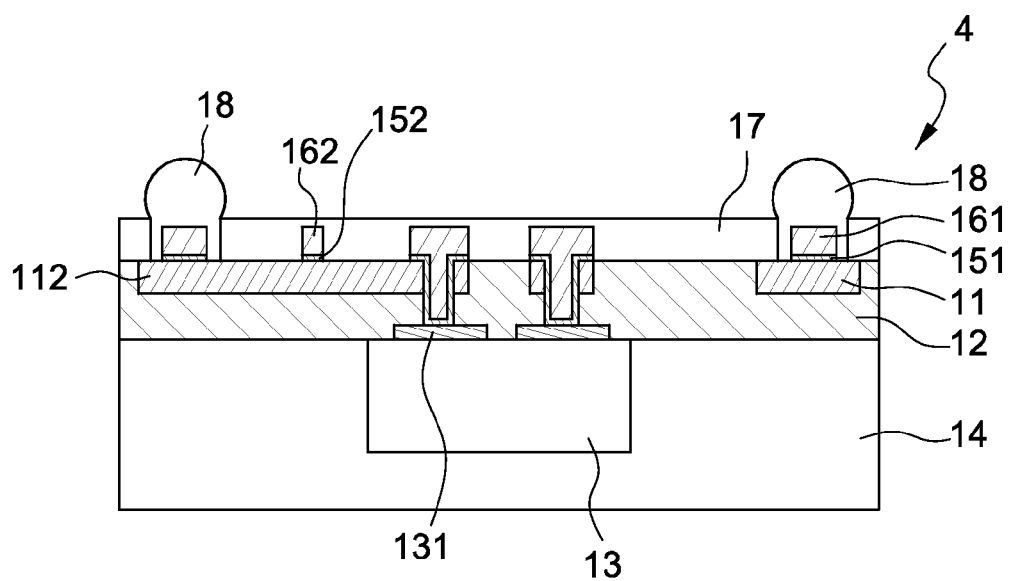
FIG. 4 illustrates a cross-sectional view of a semiconductor package in accordance with another embodiment of the present disclosure.

FIG. 4 illustrates a cross-sectional view of a semiconductor package structure in accordance with another embodiment of the present disclosure. The semiconductor package structure 4 may be similar to the semiconductor package structure 3 as described and illustrated with reference to FIG. 3, except that a part 152 of patterned conductive layer 15 and a part 162 of patterned conductive layer 16 may be disposed on the patterned conductive layer 11. As compared to the semiconductor package structure 3 illustrated and described with reference to FIG. 3, the part 152 of patterned conductive layer 15 and the part 162 of patterned conductive layer 16 may provide greater conductive area through which electrical current may pass to the patterned conductive layer 11. Accordingly, the electrical conductivity of the patterned conductive layer 11 is enhanced. During the operation of plating patterned conductive layer 16, if the pattern to be plated has a relatively small plating area, it may not easy to form an even layer. The part 152 of patterned conductive layer 15 and the part 162 of patterned conductive layer 16 can also improve the quality of the operation of plating patterned conductive layer 16 (as shown in FIG. 2J & FIG. 2K) since plating area thereof is increased or enlarged.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

In some embodiments, two surfaces can be deemed to be coplanar or substantially coplanar if a displacement between the two surfaces is small, such as no greater than 1 μm, no greater than 5 μm, or no greater than 10 μm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package comprising:
   an encapsulation layer having a first surface, the encapsulation layer comprising a first material;
   a component within the encapsulation layer, the component having a front surface and comprising a plurality of pads on the front surface;
   a dielectric layer on the first surface of the encapsulation layer, the dielectric layer comprising a second material, and the dielectric layer defining a plurality of via holes; wherein the first material is different than the second material; wherein the plurality of pads of the component are against the dielectric layer; and wherein the dielectric layer has a second surface opposite the first surface of the encapsulation layer, and each of the plurality of via holes extends from the second surface of the dielectric layer to a respective one of the plurality of pads; and
   a first patterned conductive layer embedded at the second surface of the dielectric layer and surrounding the via holes.

2. The semiconductor package of claim 1, wherein the first patterned conductive layer has a third surface that is coplanar with the second surface of the dielectric layer.

3. The semiconductor package of claim 1, wherein the encapsulation layer covers side and bottom surfaces of the component.

4. The semiconductor package of claim 1, wherein a first part of the first patterned conductive layer and a portion of the dielectric layer form a side wall of each of the via holes, wherein each of the plurality of pads forms a bottom of a corresponding via hole.

5. The semiconductor package of claim 4, further comprising a second patterned conductive layer continuously and conformally formed on the second surface of the dielectric layer, and on the side wall and the bottom of the via holes.

6. The semiconductor package of claim 5, further comprising a third patterned conductive layer disposed on the second patterned conductive layer.

7. The semiconductor package of claim 6, wherein the third patterned conductive layer extends beyond the second surface of the dielectric layer.

8. The semiconductor package of claim 1, wherein the front surface of the component is coplanar with the first surface of the encapsulation layer.

9. A semiconductor package comprising:
   a die comprising a die body and a plurality of pads, the die body having a front surface on which the plurality of pads are disposed;
   an encapsulation layer having an upper surface, the encapsulation layer encapsulating the die body while exposing the front surface of the die body from the upper surface of the encapsulation layer, the encapsulation layer comprising a first material;
   a first dielectric layer disposed on the upper surface of the encapsulation layer and covering the plurality of pads, the first dielectric layer comprising a second material different than the first material; wherein the first dielectric layer has an upper surface opposite the upper surface of the encapsulation layer;
   a plurality of conductive members penetrating through the first dielectric layer; and
   a patterned conductive layer embedded at the upper surface of the first dielectric layer and electrically connected to the pads through the conductive members.

10. The semiconductor package of claim 9, wherein an upper surface of the patterned conductive layer is coplanar with the upper surface of the first dielectric layer.

11. The semiconductor package of claim 9, wherein the patterned conductive layer includes a plurality of rings, each ring defining a periphery of a conductive member.

12. The semiconductor package of claim 11, wherein each of the conductive members directly connects a respective one of the rings and a respective one of the pads.

13. The semiconductor package of claim 12, wherein the conductive members include an electroless deposited copper layer directly connecting the rings and the pads.

14. The semiconductor package of claim 11, wherein the conductive members include an electroless deposited copper layer and a plating copper layer.

15. The semiconductor package of claim 9, further comprising a second dielectric layer covering the first dielectric layer and exposing a part of the patterned conductive layer.

16. The semiconductor package of claim 15, further comprising a second patterned conductive layer on the exposed part of the patterned conductive layer.

17. A semiconductor package comprising:
 a die comprising a die body and a plurality of pads, the die body having a front surface on which the plurality of pads are disposed;
 an encapsulation layer having an upper surface, the encapsulation layer encapsulating the die body while exposing the front surface of the die body from the upper surface of the encapsulation layer;
 a first dielectric layer disposed on the upper surface of the encapsulation layer and covering the plurality of pads;
 a plurality of conductive members penetrating the first dielectric layer; and
 a patterned conductive layer embedded in the first dielectric layer and electrically connected to the pads through the conductive members,
 wherein the patterned conductive layer includes a plurality of rings, each ring surrounding a periphery of a corresponding conductive member; and
 wherein each of the conductive members directly connects a respective one of the rings and a respective one of the pads.

18. The semiconductor package of claim 1, wherein the first patterned conductive layer defines openings, each opening aligned with a corresponding via hole such that the first patterned conductive layer surrounds the corresponding via hole.

19. The semiconductor package of claim 9, wherein the patterned conductive layer includes a plurality of rings, each ring defining a periphery of a conductive member, and each of the conductive members directly connects a respective one of the rings and a respective one of the pads.

* * * * *